(12) United States Patent
Hsu et al.

(10) Patent No.: US 7,091,550 B2
(45) Date of Patent: Aug. 15, 2006

(54) NON-VOLATILE MEMORY DEVICE AND METHOD OF MANUFACTURING THE SAME

(75) Inventors: Hann-Jye Hsu, Taichung (TW); Ko-Hsing Chang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/707,704

(22) Filed: Jan. 6, 2004

(65) Prior Publication Data
US 2005/0082600 A1 Apr. 21, 2005

(51) Int. Cl.
*H01L 21/336* (2006.01)

(52) U.S. Cl. .............. 257/317; 257/318; 257/319; 257/320; 257/321; 438/260; 438/262; 438/263

(58) Field of Classification Search ............. 257/315, 257/316, 312, 323, 324; 365/185.18, 185.28
See application file for complete search history.

(56) References Cited

U.S. PATENT DOCUMENTS 6,335,554 B1 * 1/2002 Yoshikawa ............. 257/316
6,699,757 B1 * 3/2004 Hwang ................... 438/262
6,754,105 B1 * 6/2004 Chang et al. .......... 365/185.18
6,963,108 B1 * 11/2005 Kang et al. ............. 257/330
2004/0004245 A1 * 1/2004 Forbes et al. ........... 257/315

* cited by examiner

Primary Examiner—Nathan J. Flynn
Assistant Examiner—Fazli Erdem
(74) Attorney, Agent, or Firm—Jiang Chyun IP Office

(57) ABSTRACT

A non-volatile memory device and method of manufacturing the same is provided. A substrate is provided and then a trench is formed in the substrate. Thereafter, a bottom oxide layer, a charge-trapping layer and a top oxide layer are sequentially formed over the substrate and the surface of the trench. A conductive layer is formed over the top oxide layer filling the trench. The conductive layer is patterned to form a gate over the trench. The top oxide layer, the charge-trapping layer and the bottom oxide layer outside the gate are removed. A source/drain doping process is carried out. Because the non-volatile memory device is manufactured within the trench, storage efficiency of the device is improved through an increase in the coupling ratio. Furthermore, more charges can be stored by increasing the depth of the trench.

8 Claims, 4 Drawing Sheets

NON-VOLATILE MEMORY DEVICE AND METHOD OF MANUFACTURING THE SAME

BACKGROUND OF INVENTION

1. Field of the Invention

The present invention relates to a memory device and manufacturing method thereof. More particularly, the present invention relates to a non-volatile memory device and method of manufacturing the same.

2. Description of the Related Art

Electrically erasable programmable read-only memory (EEPROM) is a non-volatile memory device that allows multiple data writing, reading, and erasing operations. In addition, the stored data will be retained even after power to the device is removed. With these advantages, it has been broadly applied in personal computer and electronic equipment. A typical EEPROM device has a floating gate and a control gate fabricated using doped polysilicon. During a programming operation, electrons injected into the floating gate will be evenly distributed over the entire polysilicon floating gate layer. Obviously, if the tunneling oxide layer underneath the polysilicon floating gate contains some defects, a leakage current will be produced and reliability of the device will be affected.

To resolve the leakage problem in an EEPROM device, the polysilicon floating gate of a conventional memory device is replaced by a charge-trapping layer. The charge-trapping layer is a silicon nitride layer with silicon oxide layers above and below the silicon nitride layer, thereby creating an oxide/nitride/oxide (ONO) composite stacked structure. An EEPROM having this stacked gate structure is often referred to as a silicon/oxide/nitride/oxide/silicon (SONOS) memory device.

FIG. 1 is a cross-sectional view of a conventional SONOS memory device. As shown in FIG. 1, an oxide/nitride/oxide (ONO) composite layer 102 is formed over a substrate 100. The ONO composite layer 102 includes a bottom oxide layer 104, a silicon nitride layer 106 and a top oxide layer 108. In addition, a polysilicon gate 112 is formed over the ONO composite layer 102 to serve as a word line. A source/drain region 118 is formed in the substrate 100 on each side of the ONO composite layer 102 to serve as a buried bit line. Spacers 116 are also formed on the sidewalls of the polysilicon gate 112. A lightly doped region 114 is formed in the substrate 100 underneath the spacers 116 to connect with the source/drain region 118 electrically.

In general, the SONOS memory device is programmed by injecting channel hot electrons (CHE) through the bottom oxide layer 104 and trapping the electrons within the ONO composite layer 102. Furthermore, data within the SONOS memory device is erased by injecting tunneling enhanced hot holes (TEHH) through the bottom oxide layer 104 and annulling the trapped electrons inside the ONO composite layer 102. The storage capacity of a SONOS memory device mainly depends on the coupling ratio. In other words, the contact area between the aforementioned top oxide layer 108 and the polysilicon gate 112.

Through the widespread miniaturization of semiconductor devices, line width of each device is shrunk correspondingly. When the contact area between the top oxide layer and the polysilicon gate inside the SONOS memory device is reduced, overall storage capacity is affected. Consequently, scientists and engineers are now working hard to find methods for increasing the coupling ratio and hence boosting the storage capacity of a SONOS memory device.

SUMMARY OF INVENTION

Accordingly, at least one objective of the present invention is to provide a non-volatile memory device with a higher coupling ratio despite device miniaturization and a method of manufacturing the same.

At least a second objective of this invention is to provide a non-volatile memory device with a smaller dimension but a higher coupling ratio so that overall storage efficiency of the device is improved.

To achieve these and other advantages and in accordance with the purpose of the invention, as embodied and broadly described herein, the invention provides a method of fabricating a non-volatile memory device. A substrate is provided and then a trench is formed in the substrate. Thereafter, a bottom oxide layer, a charge-trapping layer and a top oxide layer are sequentially formed over the substrate and the surface of the trench. A conductive layer is formed over the top oxide layer filling the trench. The conductive layer is patterned to form a gate over the trench. The top oxide layer, the charge-trapping layer and the bottom oxide layer outside the gate are removed. Finally, a source/drain doping process is carried out.

This invention also provides a non-volatile memory device. The non-volatile memory device includes a substrate, a gate, a bottom oxide layer, a charge-trapping layer, a top oxide layer and a plurality of source/drain regions. The substrate has a trench. The gate is located over and completely filling the trench. The bottom oxide layer is located between the gate and the trench surface. The charge-trapping layer is located between the gate and the bottom oxide layer and the top oxide layer is located between the gate and the charge-trapping layer. The source/drain regions are located within the substrate outside the gate.

Because the non-volatile memory device is fabricated within a trench in this invention, the coupling ratio of the device can be increased under the same device dimension so that the storage efficiency of the memory device is improved. Furthermore, depth of the trench is adjustable so that more charges can be stored inside the non-volatile memory device. In other words, the threshold voltage ($V_t$) for programming data can be changed by adjusting the depth of the trench. In addition, the process for fabricating the non-volatile memory is a single polysilicon process and hence is also applicable in an embedded process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
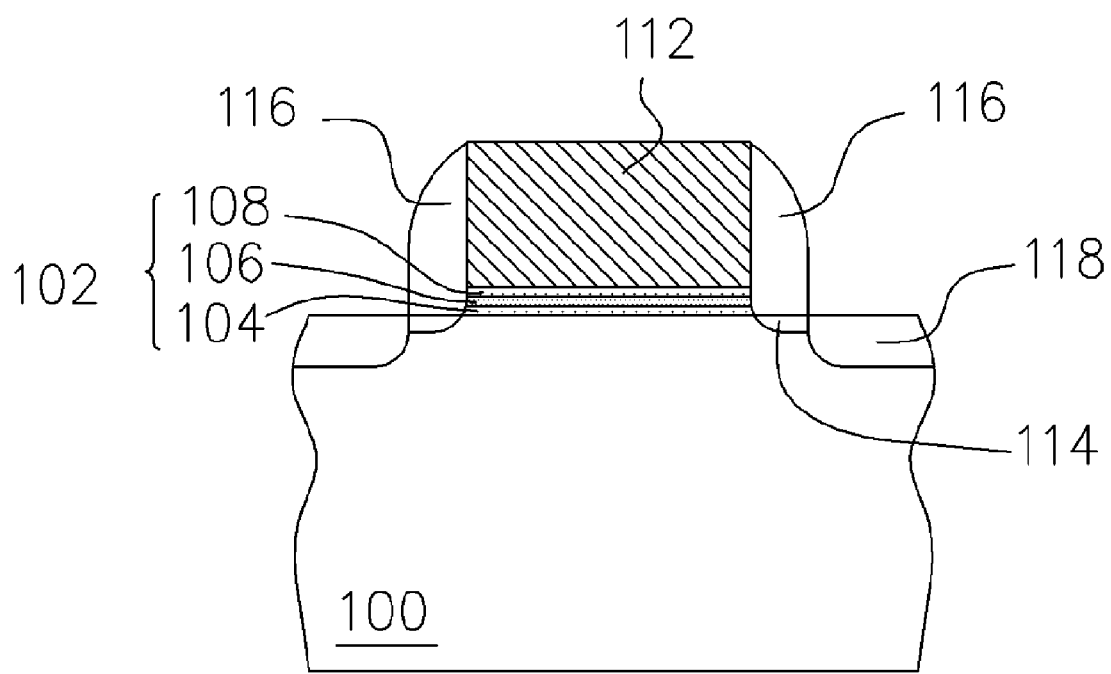
FIG. 1 is a cross-sectional view of a conventional SONOS memory device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
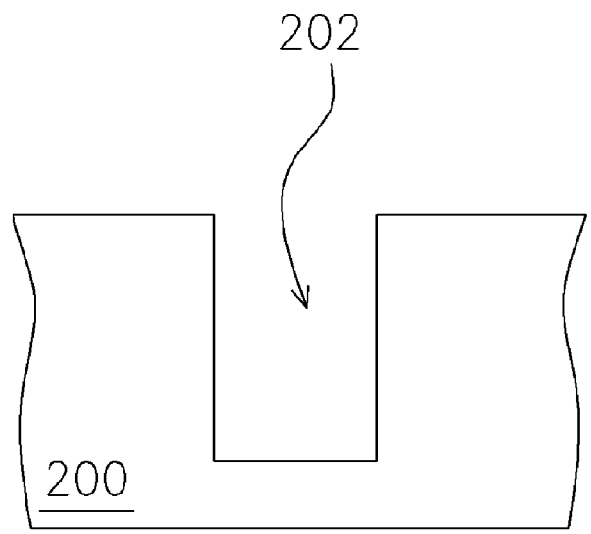
FIGS. 2A through 2D are schematic cross-sectional views showing the progression of steps for fabricating a non-volatile memory device according to one preferred embodiment of this invention.

FIGS. 2A through 2D are schematic cross-sectional views showing the progression of steps for fabricating a non-volatile memory device according to one preferred embodiment of this invention. As shown in FIG. 2A, a substrate 200 is provided. Thereafter, a trench 202 is formed in the substrate 200. To form the trench 202, a pad oxide layer (not shown) is first formed over the substrate 200. A patterned mask layer (not shown) fabricated from silicon nitride or other suitable material is next formed over the pad oxide layer. Using the patterned mask layer as a mask, the exposed pad oxide layer and a portion of the substrate 200 is removed. Finally, the pad oxide layer and the patterned mask layer are removed.

Figure 2B:
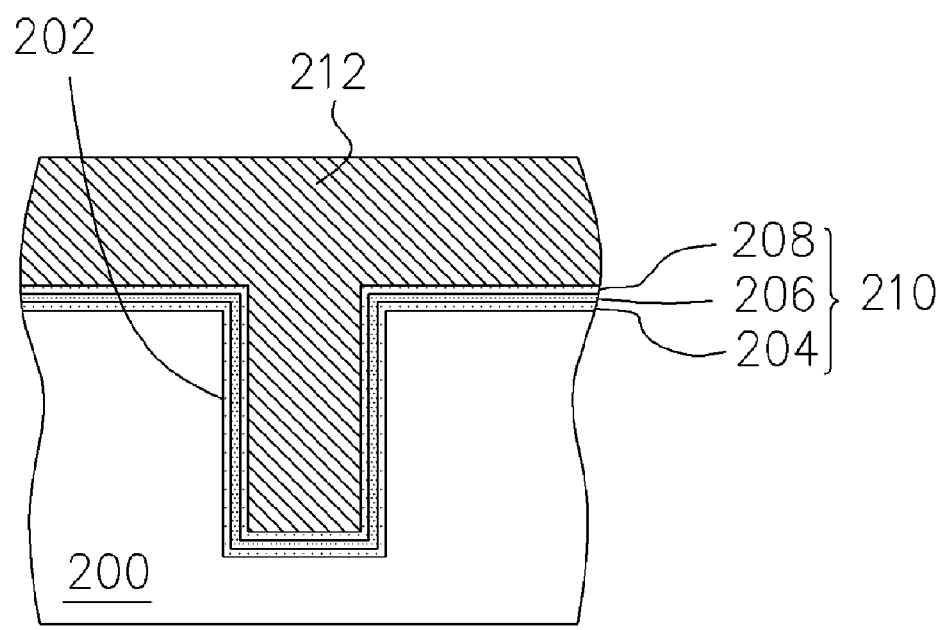

As shown in FIG. 2B, a bottom oxide layer 204 is formed over the substrate 200 and the surface of the trench 202. The bottom oxide layer 204 is a silicon oxide layer formed, for example, by performing a thermal oxidation process. Thereafter, a charge-trapping layer 206 is formed over the bottom oxide layer 204. The charge-trapping layer 206 can be a silicon nitride layer formed, for example, by performing a chemical vapor deposition (CVD) process. Furthermore, the charge-trapping layer 206 can be a nitridation layer, a tantalum oxide layer, a titanic strontium layer or a hafnium oxide layer, for example. A top oxide layer 208 is formed over the charge-trapping layer 206. The top oxide layer 208 can be a silicon oxide layer, for example. A conductive layer 212 that fills the trench 202 is formed over the top oxide layer 208. The conductive layer 212 is fabricated using polysilicon or some other suitable material, for example. The bottom oxide layer 204, the charge-trapping layer 208, the top oxide layer 208, the conductive layer 212 together form the stacked structure of a silicon/oxide/nitride/oxide/silicon (SONOS) memory device.

Figure 2C:
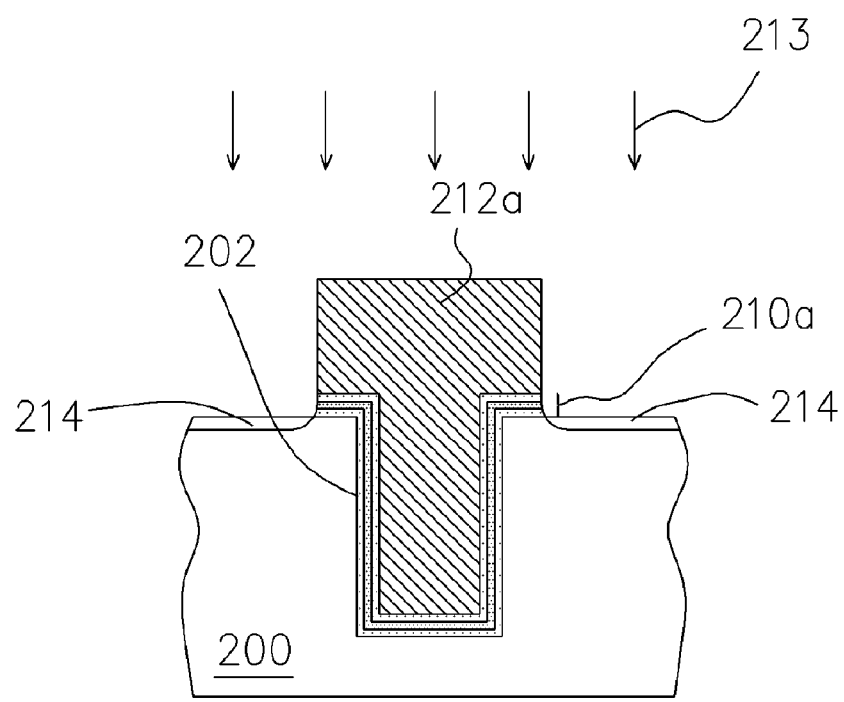

As shown in FIG. 2C, the conductive layer 212 is patterned to form a gate 212a over the trench 202. The gate 212a may extend over a portion of the substrate 200 (as shown in the figure) outside the trench 202 or may form directly over the trench 202. Thereafter, the bottom oxide layer 204, the charge-trapping layer 206 and the top oxide layer 208 outside the gate 212a are removed to form an oxide/nitride/oxide (ONO) composite layer 210a. Afterwards, a light doping process 213 may be selectively carried out to form a lightly doped region 214 in the substrate 200 outside the gate 212a.

Figure 2D:
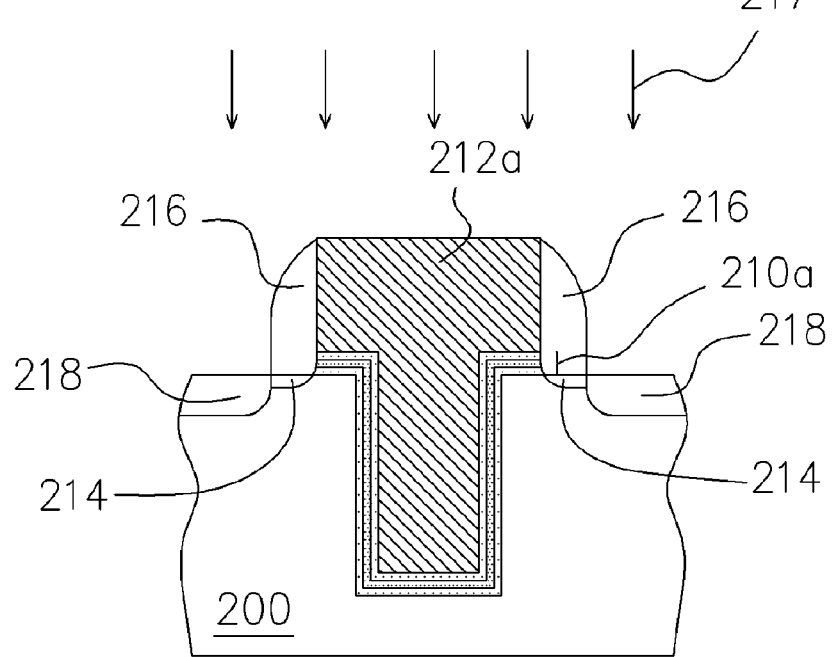

As shown in FIG. 2D, spacers 216 are selectively formed on the sidewalls of the gate 212a. The spacers 216 are fabricated using, for example, silicon nitride or some other suitable material. Thereafter, a source/drain doping process 217 is carried out to form source/drain regions 218 in the substrate 200 outside the gate spacers 216. After the source/drain doping process 217, a self-aligned silicide (Salicide) process may be carried out to form a metal silicide layer (not shown) on the surface of the gate 212a. The silicide layer can be a cobalt silicide layer, a titanium silicide layer, a tungsten silicide layer, a molybdenum silicide layer, a platinum silicide layer or a nickel silicide layer, for example. Furthermore, before performing the salicide process, a salicide block (SAB) layer is often formed over a portion of the substrate 200 to cover areas where a silicide layer is not required.

Figure 3:
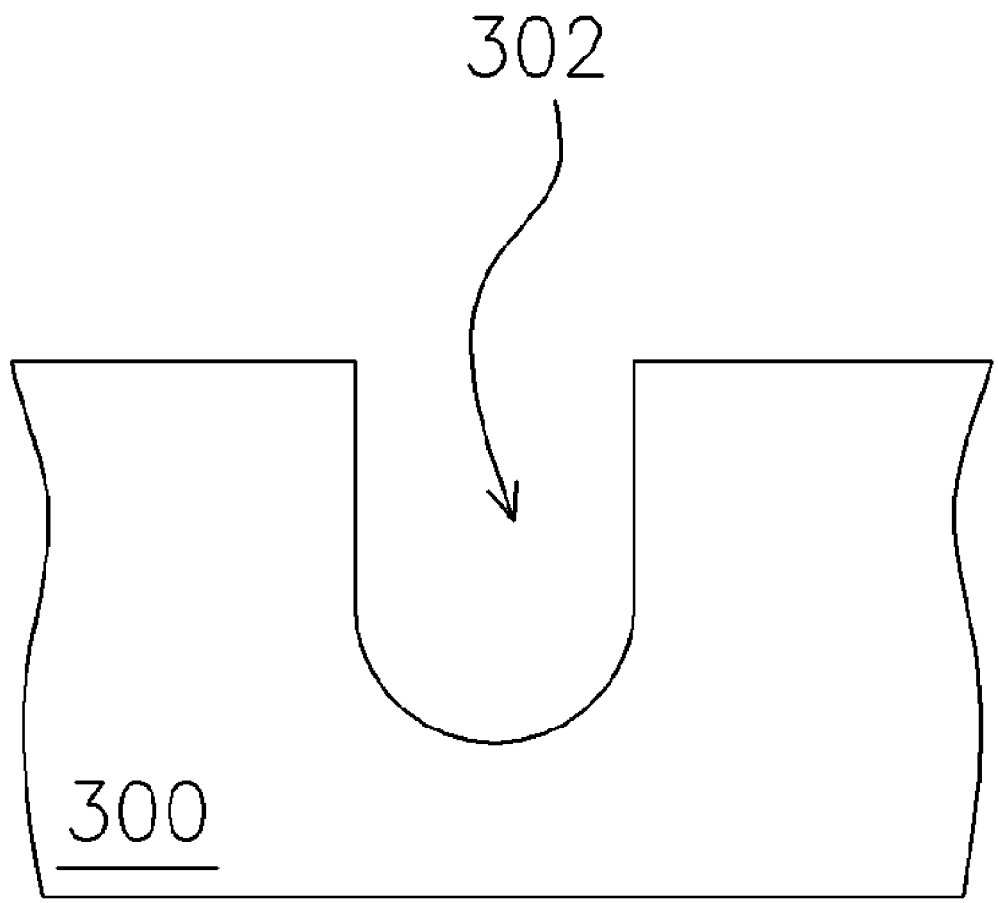
FIG. 3 is a cross-sectional view of a trench in a non-volatile memory device according to another embodiment of this invention.

In addition, the trench 202 can have a smooth profile aside from the one shown in FIGS. 2A through 2D. FIG. 3 is a cross-sectional view of a trench in a non-volatile memory device according to another embodiment of this invention. As shown in FIG. 3, a smooth trench 302 instead of the square bottom trench 202 as shown in FIGS. 2A through 2D is formed in a substrate 300.

In summary, one major aspect of this invention is the fabrication of a non-volatile memory device inside a trench so that the coupling ratio of the device can be increased under the same device dimension. Ultimately, the storage efficiency of the memory device is improved. Furthermore, depth of the trench is adjustable so that more charges can be stored inside the non-volatile memory device. In other words, the threshold voltage ($V_t$) for programming data can be changed by adjusting the depth of the trench. In addition, the process for fabricating the non-volatile memory is a single polysilicon process and hence is also applicable in an embedded process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A non-volatile memory device, comprising:
   a substrate, wherein the substrate has a trench;
   a gate disposed over and completely filling the trench, wherein a part of the gate is protruded above the substrate;
   a plurality of spacers located on the sidewalls of the protruded part of the gate;
   a bottom oxide layer disposed between the gate and the trench surface;
   a charge-trapping layer disposed between the gate and the bottom oxide layer, wherein the charge-trapping layer is conformal to a bottom surface of the trench and at least one sidewall of the trench;
   a top oxide layer disposed between the gate and the charge-trapping layer;
   a plurality of lightly doped regions located in the substrate underneath the spacers; and
   a plurality of source/drain regions located at both sides of the trench in the substrate.

2. The non-volatile memory device of claim 1, wherein the gate extends over a portion of the substrate outside the trench.

3. The non-volatile memory device of claim 2, wherein bottom oxide layer further extends out of the trench and is disposed between the gate and the substrate.

4. The non-volatile memory device of claim 1, wherein material constituting the spacers comprises silicon nitride.

5. The non-volatile memory device of claim 1, wherein material constituting the gate comprises polysilicon.

6. The non-volatile memory device of claim 1, wherein material constituting the charge-trapping layer is selected from the group consisting of a nitride compound, tantalum oxide, titanic strontium and hafnium oxide.

7. The non-volatile memory device of claim 1, wherein the device further comprises a silicide layer disposed on the gate surface.

8. The non-volatile memory device of claim 7, wherein material constituting the metal silicide layer is selected from the group consisting of cobalt silicide, titanium silicide, tungsten silicide, molybdenum silicide, platinum silicide and nickel silicide.

* * * * *